United States Patent
Chen et al.

(10) Patent No.: US 7,291,788 B2
(45) Date of Patent: Nov. 6, 2007

(54) CIRCUIT SUBSTRATE

(75) Inventors: Jia-Cheng Chen, Kaohsiung (TW); Yi-Chuan Ding, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 11/162,411

(22) Filed: Sep. 9, 2005

(65) Prior Publication Data

US 2006/0054348 A1 Mar. 16, 2006

(30) Foreign Application Priority Data

Sep. 13, 2004 (TW) ............................. 93127619 A

(51) Int. Cl.
*H05K 1/03* (2006.01)
(52) U.S. Cl. ....................... 174/255; 361/772
(58) Field of Classification Search ................ 174/255; 361/772–776

See application file for complete search history.

(56) References Cited

U.S. PATENT DOCUMENTS

| | | | | | |
|---|---|---|---|---|---|
| 5,177,596 A | * | 1/1993 | Muramatsu et al. | ........ | 174/254 |
| 5,253,415 A | * | 10/1993 | Dennis | ........................ | 29/827 |
| 5,990,547 A | * | 11/1999 | Sharma et al. | ............... | 257/700 |
| 6,399,417 B1 | * | 6/2002 | Lee et al. | .................... | 438/106 |
| 6,469,258 B1 | * | 10/2002 | Lee et al. | .................... | 174/261 |
| 6,593,658 B2 | * | 7/2003 | Huang et al. | ............... | 257/773 |
| 2003/0137035 A1 | * | 7/2003 | Huang et al. | ............... | 257/668 |
| 2004/0159946 A1 | * | 8/2004 | Moxham et al. | ............. | 257/738 |

* cited by examiner

*Primary Examiner*—Jeremy C Norris
(74) *Attorney, Agent, or Firm*—Jianq Chyun IP Office

(57) ABSTRACT

A circuit substrate includes a base and a plurality of conductive traces. The conductive traces are disposed on the base and on the same layer. The conductive traces include at least one first conductive trace. Wherein, the base has a cut region. The end of the first conductive trace is connected to the end portion of the cut region. The included angle between the rim of the end portion of the cut region and the first conductive trace is 75° to 105°.

8 Claims, 2 Drawing Sheets

CIRCUIT SUBSTRATE

CROSS-REFERENCE TO RELATED APPLICATION

This application claims the priority benefit of Taiwan application serial no. 93127619, filed on Sep. 13, 2005. All disclosure of the Taiwan application is incorporated herein by reference.

BACKGROUND OF THE INVENTION

1. Field of Invention

The present invention relates to a substrate. More particularly, the present invention relates to a circuit substrate.

2. Description of Related Art

Nowadays, the market of various electric devices is continuously expanding in the highly informative society. Chip package technology is also developed toward the trend of more micronization and high density in order to satisfy electric components for rapid processing, multi-function, high integration, minitype portability and low price. Accordingly, the carrier for the chip package technology, specifically, the carrier for the chip package technology of Ball Grid Array (BGA) and Pin Grid Array (PGA), is in the progress of high layout integration. The rigid substrate has become the most commonly used carrier in the high density chip package technology due to the circuit arrangement of both high density and high pin count provided by the rigid substrate.

In the traditional art, generally, a plated anti-oxidation layer, such as a Ni/Au layer on the surface of a plurality of bonding pads is formed to both prevent the surfaces of the bonding pads made of copper from oxidation and increase joint strength of the bonding pads after transmission circuits and a solder mask of the circuit substrate are formed thereon in the manufacturing process of the circuit substrate, such as a chip carrier for the chip package. The bonding pads connected to the transmission circuits may be connected to a plating bar respectively to gain exterior electrical connection for making the surfaces of the bonding pads plating.

A plurality of subsequent processes such as die bonding, wire bonding, molding and trimming etc. can be made in succession after the anti-oxidation metal layer is formed on the surfaces of the bonding pads in the chip carrier. The plating bar on the chip carrier thereupon may be cut off while making various transmission circuits electrically independent one another in the trimming process to form a plurality of separate chip packages including chips and chip carriers.

FIG. 1 is a partial view illustrating a traditional circuit substrate after the plating bars are cut off. Referring to FIG. 1, there are a plurality of circuits 110 and a hollow region 120 on a circuit substrate 100. Wherein, the hollow region 120 is the area which a plating bar (not shown) was originally formed on the circuit substrate 100 and the hollow region 120 is about a strip shape. Traditionally, when the plating bar of the circuit substrate 100 is cut off to form the hollow region 120, the cutting will stop at the end of the plating bar; any portion of the circuit 110 will not be cut off. Further, a solder mask 130 is also formed on the circuit substrate 100 to cover the circuits 110. The hollow region 120 is exposed at one opening of the solder mask 130 and the area of the hollow region 120 is substantially the same as the area of the opening. In the traditional circuit substrate 100, the circuits 110 at least include a circuit 112 which is connected to the end of the plating bar, that is, connected to the end of the hollow region 120. Moreover, an included angle between the circuit 112 and the rim of the hollow region 120 at the end portion of the hollow region 120 where the circuit 112 is connected to is very small (herein shown as θ1).

As described above, when the plating bar is cut away from the circuit substrate 100 to form the hollow region 120, since the included connection angle θ1 between the circuit 112 and the hollow region 120 is too small, there are burrs generally produced in the portion of the circuit 112 near the margin of the hollow region 120. Then, the remnant burrs produced at the time when the plating bar is cut away often decrease the process quality of the circuits 110 which should be electrically independent one another in the circuit substrate 100. Moreover, the circuit substrate 100 may be short fault such that the substrate 100 can not work normally.

SUMMARY OF THE INVENTION

Accordingly, an object of the present invention is directed to provide a circuit substrate for enhancing the process quality of the circuit substrate when a plating bar is cut and for increasing the production performance of the circuit substrate after the plating bar is cut off.

The present invention provides a circuit substrate which mainly includes a base and a plurality of conductive traces. The conductive traces are disposed on the base and on the same layer. The conductive traces include at least one first conductive trace. Wherein, the base has a cut region. The end of the first conductive trace is connected to the end portion of the cut region. The included angle between the rim of the end portion of the cut region and the first conductive trace is 75° to 105°.

The included angle between the rim of the end portion of the cut region and the first conductive trace in the circuit substrate is, for example, 85° to 95°. Or, the included angle between the rim of the end portion of the cut region and the first conductive trace in the circuit substrate is, for example, 90°. Moreover, the circuit substrate, for example, further includes a solder mask which is formed on the base and lays over the conductive traces.

The present invention further provides another circuit substrate including mainly a base, a plating bar and a plurality of conductive traces. The plating bar is conFIGured on the base and is about a long strip. The conductive traces are conFIGured on the base and are on the same layer as the plating bar. The conductive traces include at least one first conductive trace. Wherein, the base has a cut region. The end of the first conductive trace is connected to the end portion of the plating bar. The included angle between the rim of the end portion of the plating bar and the first conductive trace is 75° to 105°.

The included angle between the rim of the end portion of the plating bar and the first conductive trace in the circuit substrate is, for example, 85° to 95°. Or, the included angle between the rim of the end portion of the plating bar and the first conductive trace in the circuit substrate is, for example, 90°. Moreover, the circuit substrate, for example, further includes a solder mask which is formed on the base and covers the plating bar and the conductive traces.

As described above, in the circuit substrate according to the present invention, since the rim of the end portion of the plating bar is substantially perpendicular to the first conductive trace, or the rim of the end portion of the cut region is substantially perpendicular to the first conductive trace, burrs occurred upon the conductive traces in the cross section after the plating bar is cut are prevented; thereby short fault caused by burrs can be avoided and the production performance of the circuit substrate can be increased.

In order to the make the aforementioned and other objects, features and advantages of the present invention comprehensible, a preferred embodiment accompanied with FIGures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
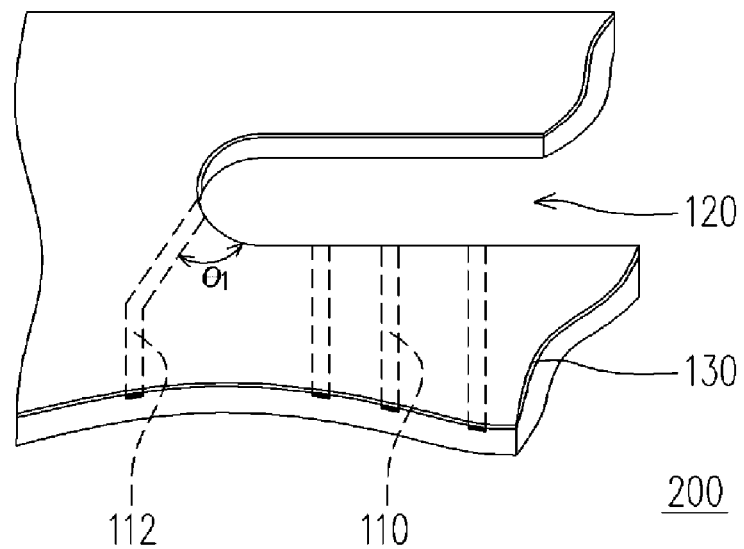
FIG. 1 is a partial schematic view showing a traditional circuit substrate after a plating bar is cut off.
Figure 2:
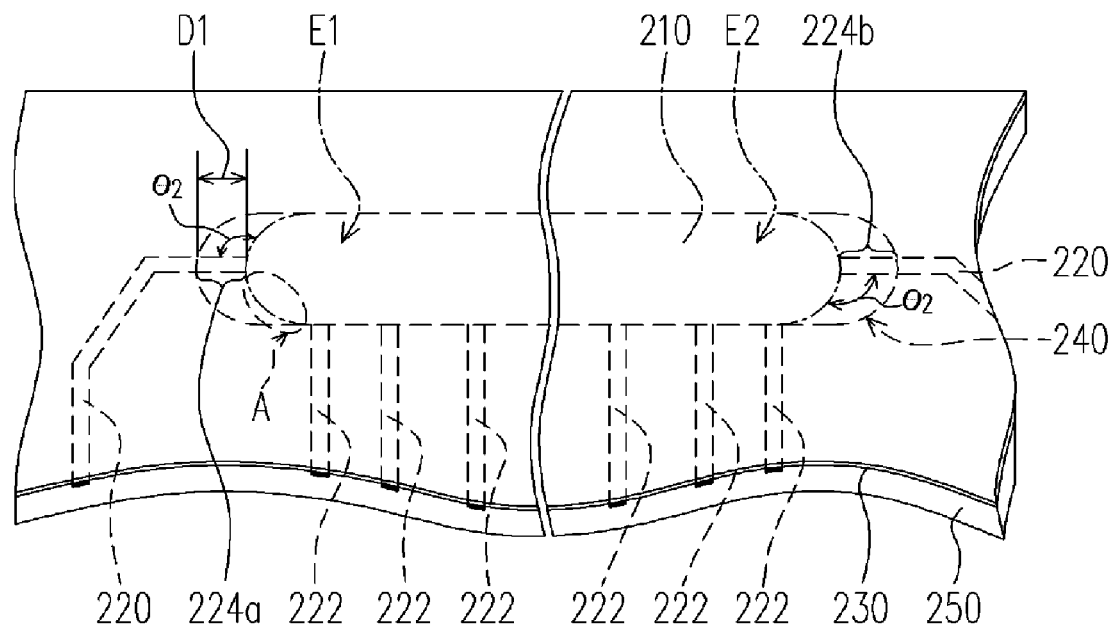
FIG. 2 is a partial schematic view showing a circuit substrate of a preferred embodiment according to the present invention.

FIG. 2 is a partial view illustrating a circuit substrate of a preferred embodiment according to the present invention. Referring to FIG. 2, a circuit substrate 200 according to the present invention is, for example, a chip package structure suitable for wire bonding or flip bonding. The circuit substrate 200 comprises a base 250, a plating bar 210 and a plurality of conductive traces 220, 222. The base 250 is formed by overlapping a plurality of patterned circuit layers and a plurality of dielectric layers. The plating bar 210 is configured on the base 250 and is about a long strip. The plating bar has a first end E1 and a second end E2. The plurality of conductive traces 220, 222 are configured on the base 250 and disposed on the same layer as the plating bar 210. Wherein, at least one conductive trace 220 (herein two traces are used for example) is respectively connected to the first end E1 and the second end E2 of the plating bar, that is, one end of the conductive trace 220 is located at the end of the plating bar 210, while another end of the conductive trace 220 is substantially parallel to the conductive trace 222. At the same time, the included angleθ2 between the rim of the end portion of the plating bar 210 and the portion of the conductive trace 220 adjacent to the plating part 210 is 75° to 105°.

Furthermore, the circuit substrate 200, for example, has a predetermined cut region 240 which contains the plating bar 210 and a part of the first conductive trace 220. In other words, the area of the predetermined cut region 240 is bigger than the area of the plating bar and contains the portion of the first conductive trace 220 connected to the plating bar 210.

Moreover, the circuit substrate 200, for example, further includes a solder mask 230 which is conFIGured on the base 250 and lays over the plating bar 210 and conductive traces 220, 222. Herein, the plating bar 210 and conductive traces 220, 222 are all made of conductor, such as copper, and are formed on the same surface of the circuit substrate 200 in the same pattern etch process.

In the circuit substrate 200 of the present embodiment, the included angleθ2 between the rim of the end portion of the plating bar 210 and the portion of the conductive trace 220 adjacent to the plating bar 210 is preferably 85° to 95°, most preferably 900.

In addition, the length D1 of the portion of the conductive trace 220 contained by the cut region 240 (such as line segments 224a, 224b) is between 200 um and 400 um, and is preferably 300 um. At the same time, the width of the portion of the conductive trace 220 contained by the cut region 240 (such as line segments 224a, 224b) may be 50 um or other selected values.

Referring to FIG. 2 again, the predetermined cut region 240 is cut away entirely by a cutting tool, for example, a minitype drill (not shown) when the plating bar 210 is cut off in the circuit substrate 200 of the present embodiment.

Further, it is preferable for the layout of the conductive traces 220,222 in the circuit substrate 200 to be disposed in the upside area and the downside area of the first end E1 and second end E2 of the plating bar 210 which are not connected to the plating bar 210 (for example, the area A shown in FIG. 2).

Figure 3:
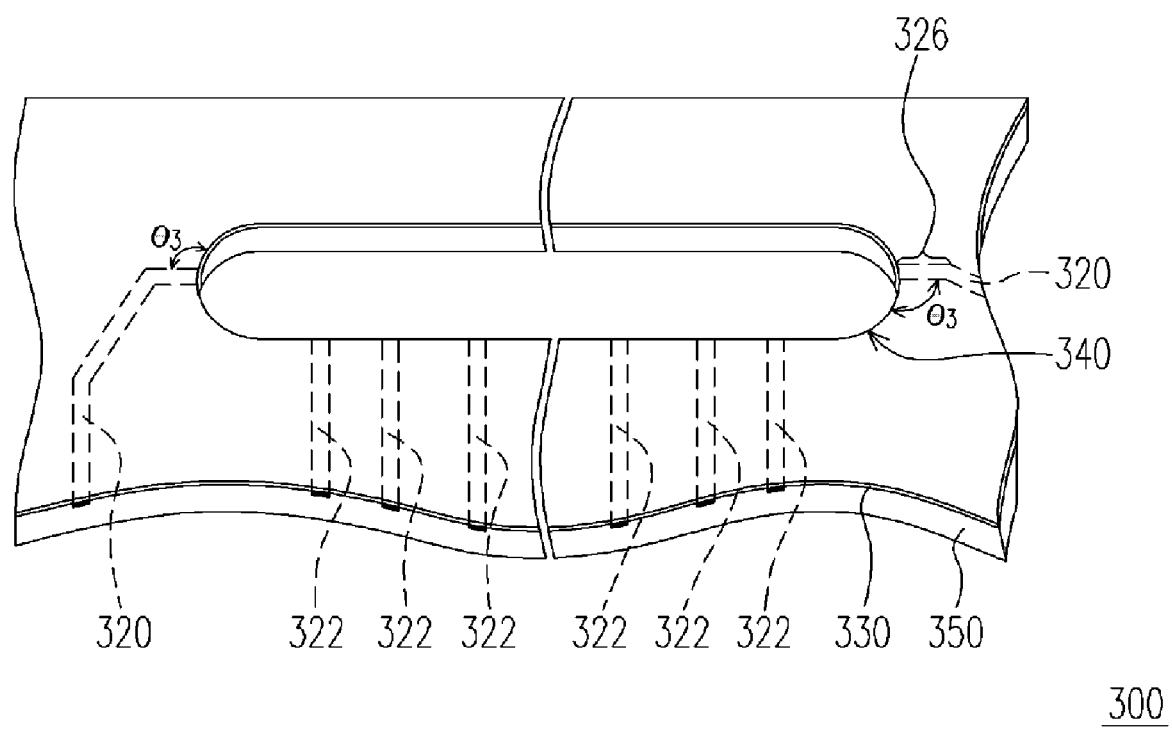
FIG. 3 is a partial schematic view showing a circuit substrate of another preferred embodiment according to the present invention.

FIG. 3 is a partial view showing a circuit substrate of another preferred embodiment according to the present invention. Referring to FIG. 3, the circuit substrate 300 of the present embodiment comprises mainly a base 350 and a plurality of conductive traces 320, 322. The base 350 is formed by overlapping a plurality of patterned circuit layers and a plurality of dielectric layers. The plurality of conductive traces 320,322 are conFIGured on the base 350 and disposed on the same layer. The conductive traces 320, 322 include at least a first conductive trace 320 (herein two traces are used for example). The circuit substrate 300 has a cut region 340. The end of the first conductive trace 320 is connected to the end portion of the cut region 340, and the included angleθ3 between the rim of the end portion of the cut region 340 and the portion (a line segment 326) of the first conductive trace 320 adjacent to the cut region 340 is 75° to 105°.

In the circuit substrate 300 of the present embodiment, the included angleθ3 is preferably 85° to 95°, and most preferably 90°. Also, the circuit substrate 300 may include a solder mask 330 which is FIGdisposed on the base 350 and covers the conductive traces 320, 322.

As illustrated above, the rim of the end portion of the plating bar is substantially perpendicular to the first conductive trace, or the rim of the end portion of the cut region is perpendicular to the first conductive trace in the circuit substrate according to the present invention. Therefore, it is unlikely that burrs will occur on the conductive traces in the cross section. As a result, short fault among the adjacent circuits caused by burrs can be avoided and the production performance of the circuit substrate can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit substrate, comprising:
   a base; and
   a plurality of conductive traces disposed on a same layer of the base and including at least a first conductive trace and a second conductive trace, wherein the circuit substrate has a cut region, and the cut region is a long strip, the cut region having a first end portion in the longitudinal direction and two sides, the first conductive trace has a first portion, a second portion and a third portion, in which the second portion is connected between the first portion and the third portion, the first portion of the first conductive trace is connected to the first end portion of the cut region and an included angle between a rim of the first end portion of the cut region and the first portion of the first conductive trace is 75° to 105°, and the second conductive trace is connected to one of the two sides, and the third end portion of the first conductive trace is substantially parallel to the second conductive trace.

2. The circuit substrate of claim 1, wherein the included angle between the rim of the first end portion of the cut region and the first conductive trace is 85° to 95°.

3. The circuit substrate of claim 1, wherein the included angle between the rim of the first end portion of the cut region and the first conductive trace is 90°.

4. The circuit substrate of claim 1, further comprising a solder mask disposed on the base and covers the conductive traces.

5. A circuit substrate, comprising:
   a base, wherein the base comprises a predetermined cut region to be removed;
   a plating bar which is disposed on said base and is about a strip shape having a first end portion in the longitudinal direction and two sides; and
   a plurality of conductive traces disposed on the base and on a same layer as the plating bar, the conductive traces include at least a first conductive trace and a second conductive trace, wherein the first conductive trace has a first portion, a second portion and a third portion in which the second portion is connected between the first portion and the third portion, the first portion of the first conductive trace is connected to the first end portion of the plating bar, and an included angle between a rim of the first end portion of the plating bar and the first portion of the first conductive trace is 75° to 105° and a part of the first portion of the first conductive trace contained in the predetermined cut region is about 200 to 400 μm long, and the second conductive trace is connected to one of the two sides of the plating bar and the third end portion of the first conductive trace is substantially parallel to the second conductive trace.

6. The circuit substrate of claim 5, wherein the included angle between the rim of the first end portion of the plating bar and the first conductive trace is 85° to 95°.

7. The circuit substrate of claim 5, wherein the included angle between the rim of the first end portion of the plating bar and the first conductive trace is 90°.

8. The circuit substrate of claim 5, further comprising a solder mask disposed on the base and covers the plating bar and the conductive traces.

* * * * *